(12) United States Patent
Li et al.

(10) Patent No.: US 10,433,441 B2
(45) Date of Patent: *Oct. 1, 2019

(54) HOUSING, METHOD FOR MANUFACTURING HOUSING, AND MOBILE TERMINAL HAVING HOUSING

(71) Applicant: Guangdong Oppo Mobile Telecommunications Corp., Ltd., Dongguan, Guangdong (CN)

(72) Inventors: Jing Li, Guangdong (CN); Guangming Yang, Guangdong (CN); Qingguo Gong, Guangdong (CN)

(73) Assignee: Guangdong Oppo Mobile Telecommunications Corp., Ltd., Dongguan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/648,933

(22) Filed: Jul. 13, 2017

(65) Prior Publication Data
US 2018/0042130 A1    Feb. 8, 2018

(30) Foreign Application Priority Data

Aug. 8, 2016  (CN) .......................... 2016 1 0645763
Aug. 8, 2016  (CN) ...................... 2016 2 0851342 U

(51) Int. Cl.
*H04M 1/02* (2006.01)
*H05K 5/02* (2006.01)
(Continued)

(52) U.S. Cl.
CPC ............. *H05K 5/0247* (2013.01); *H01Q 1/12* (2013.01); *H04M 1/0202* (2013.01);
(Continued)

(58) Field of Classification Search
CPC ...... H04M 1/0249; H04M 1/02; H04M 1/026; H04M 1/0202; H04M 1/0283; B32B 7/12;
(Continued)

(56) References Cited

U.S. PATENT DOCUMENTS 8,373,610 B2   2/2013 Chiang et al.
8,975,540 B2 * 3/2015 Mareno ............. B29C 45/14311
                                                                    174/559
(Continued)

FOREIGN PATENT DOCUMENTS

CN      102006754 A    4/2011
CN      104540341 A    4/2015
(Continued)

OTHER PUBLICATIONS

Extended European Search Report issued in corresponding European Application No. 17181185.4 dated Oct. 25, 2017 (7 pp).
(Continued)

*Primary Examiner* — Pablo N Tran
(74) *Attorney, Agent, or Firm* — Young Basile Hanlon & MacFarlane, P.C.

(57) ABSTRACT

A housing, a method for manufacturing the housing, and a mobile terminal having the housing include a substrate including a metal area, a slot defined in the metal area of the substrate and penetrating through the substrate, and a filling layer received in the slot and including an insulating layer and a paint layer on the insulating layer.

12 Claims, 4 Drawing Sheets

(51) Int. Cl.
    *G06F 1/16* (2006.01)
    *H01Q 1/12* (2006.01)
    *H01Q 1/24* (2006.01)

(52) U.S. Cl.
    CPC ......... *H04M 1/026* (2013.01); *H04M 1/0283* (2013.01); *H01Q 1/243* (2013.01)

(58) Field of Classification Search
    CPC ....... B32B 27/06; B32B 37/12; B32B 38/145; B32B 2309/105; H05K 5/02; H05K 5/04; H05K 5/0243; G06F 1/16; G06F 1/1656; C09D 11/328
    See application file for complete search history.

(56) References Cited

U.S. PATENT DOCUMENTS

| | | | | |
|---|---|---|---|---|
| 9,166,279 | B2 * | 10/2015 | Jin | ............... H01Q 1/243 |
| 9,716,307 | B2 * | 7/2017 | Tsai | ............... H01Q 13/106 |
| 2009/0239068 | A1 * | 9/2009 | Shi | ............... H05K 5/0243 |
| | | | | 428/339 |
| 2010/0097276 | A1 * | 4/2010 | Lin | ............... B44C 5/0453 |
| | | | | 343/702 |
| 2013/0280550 | A1 * | 10/2013 | Huang | ............... B29C 45/14344 |
| | | | | 428/626 |

FOREIGN PATENT DOCUMENTS

| | | | |
|---|---|---|---|
| CN | 105322290 | A | 2/2016 |
| CN | 105517389 | A | 4/2016 |
| CN | 105530783 | A | 4/2016 |
| CN | 105682401 | A | 6/2016 |
| CN | 105813422 | A | 7/2016 |
| CN | 205883339 | U | 1/2017 |
| EP | 3282676 | A1 * | 2/2018 ............... H01Q 1/12 |
| WO | 2011051408 | A1 | 5/2011 |
| WO | 2018028372 | A1 | 2/2018 |

OTHER PUBLICATIONS

International Search Report issued in corresponding International Application No. PCT/CN2017/092417 dated Sep. 27, 2017 (12 pp).

* cited by examiner

HOUSING, METHOD FOR MANUFACTURING HOUSING, AND MOBILE TERMINAL HAVING HOUSING

CROSS-REFERENCE TO RELATED APPLICATION(S)

The present application claims priority to Chinese Patent Application No. 201610645763.0 filed on Aug. 8, 2016, and to Chinese Patent Application No. 201620851342.9 filed on Aug. 8, 2016, contents of both of which are hereby incorporated by reference in their entireties.

TECHNICAL FIELD

The present disclosure relates to electronic devices, and more particularly, to a housing for a mobile terminal, a method for manufacturing the housing, and a mobile terminal having the housing.

BACKGROUND

As a mobile terminal such as a mobile phone need receive signals, a slot should be formed in the housing of the mobile terminal for an antenna. Radio Frequency (RF) requires that filler material in the slot be non-conductive material so as to improve radiation performance of the antenna. In general, the slot is filled with plastic such as polyphenylene sulfite (PPS) or polybutylene terephthalate (PBT), while the other part (i.e. substrate) of the housing is generally made from aluminum alloy and has an anodized appearance. However, the plastic in the slot has a color quite different from that of the anodized aluminum alloy of the substrate, which seriously destroys the unity of the housing. Therefore, the antenna and the housing of the current mobile terminal are still to be improved.

DETAILED DESCRIPTION

The implementations of the present disclosure will be described in detail hereinafter. The implementations described below are examples and merely illustrative of the present disclosure, and are not to be construed as a limit to the present disclosure. Those without specific technologies and conditions in the implementations are performed according to technologies and conditions described in documents in the art, or according to product specifications. Reagents or instruments of which manufacturers are not indicated are commercially available conventional ones.

In one aspect of the present disclosure, a housing for a mobile terminal is provided. Referring to FIGS. 1 to 4, the housing includes a substrate 1, a slot 2 formed in the substrate 1, and a filling layer 3, according to an implementation of the present disclosure.

According to one implementation of the present disclosure, the substrate 1 has a shape not particularly limited and may be flexibly shaped by persons skilled in the art, as long as the substrate 1 can be mated with other members constituting the mobile terminal. According to one implementation of the present disclosure, the material forming the substrate 1 is also not particularly limited, and may be any material known in the art capable of forming the housing of the mobile terminal, for example, including, but not limited to, aluminum alloy and the like. In some implementations of the present disclosure, the substrate at least has a metal area, or part or all of the substrate is made from metal. In order to improve surface hardness and abrasion resistance of the metal substrate, expand the application scope thereof, and prolong the service life thereof, generally, the substrate 1 is anodized. Therefore, an anodized layer 11 is formed on the outer surface of the substrate 1.

Figure 1:
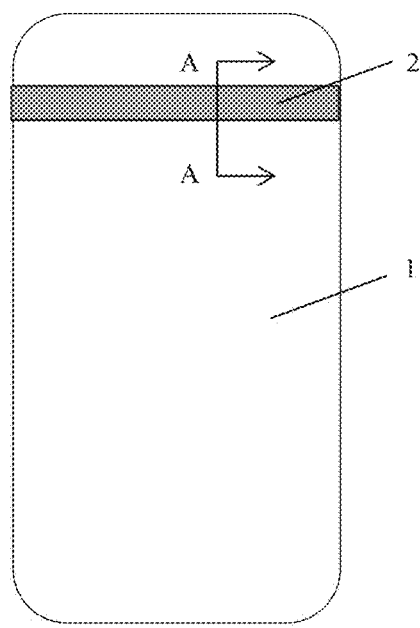
FIG. 1 illustrates a schematic structural diagram of an outer surface of a housing according to an implementation of the present disclosure.
Figure 2:
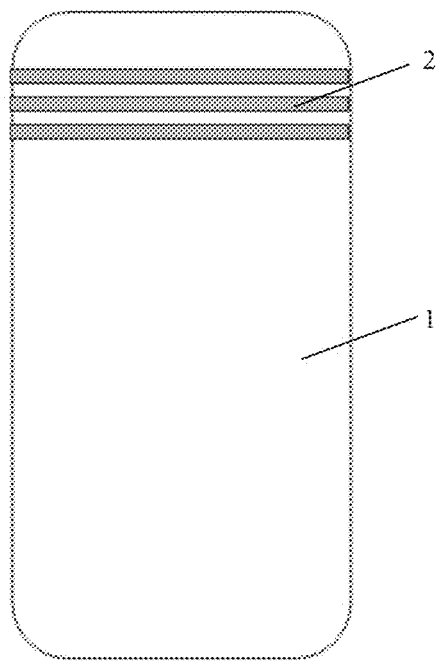
FIG. 2 illustrates a schematic structural diagram of an outer surface of a housing according to another implementation of the present disclosure.

According to one implementation of the present disclosure, the slot 2 is defined in the metal area of the substrate 1 and penetrates through the metal area of the substrate 1, and the slot 2 is filled with the filling layer 3. According to one implementation of the present disclosure, position, shape, number, etc., of the slot(s) 2 are not particularly limited, and any slot known in the art formed for the antenna is applicable here, as long as signals can be transmitted out. In some implementations of the present disclosure, the position, shape, number, etc., of the slot(s) 2 may be as illustrated in FIG. 1 or FIG. 2.

Figure 3:
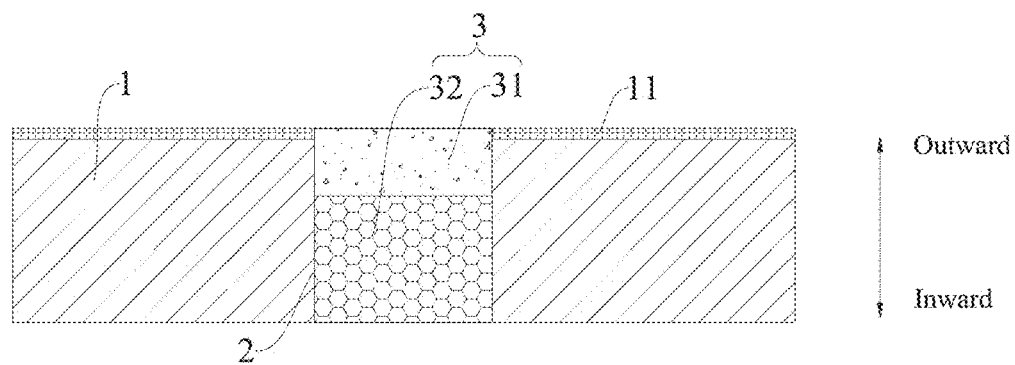
FIG. 3 illustrates a schematic cross-sectional structural view of a housing according to an implementation of the present disclosure.
Figure 4:
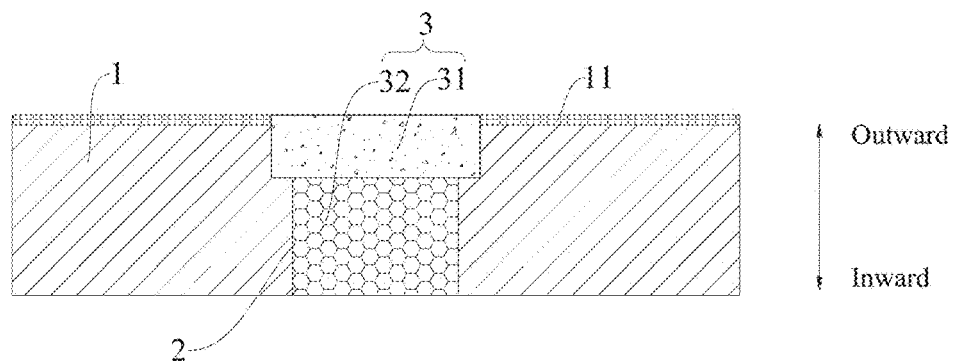
FIG. 4 illustrates a schematic cross-sectional structural view of a housing according to another implementation of the present disclosure.

According to one implementation of the present disclosure, the filling layer 3 is received in the slot 2, and includes an insulating layer 32 and a paint layer 31 on the insulating layer 32. Thus, the paint layer 31 covers the insulating layer 32 received in the slot. The outer surface of the paint layer 31 may have substantially the same color as the outer surface of the substrate 1, such that color difference between the slot and the outer surface of the substrate 1 can be reduced conveniently and effectively, thereby improving the unity of the mobile terminal. According to one implementation of the present disclosure, the paint layer 31 may has a width no less than the insulating layer 32 (FIG. 3 illustrates that the paint layer 31 has the same width as the insulating layer 32), thereby ensuring that the paint layer 31 covers the insulating layer 32 (e.g., the entire insulating layer 32), and avoiding exposure of a part of the insulating layer 32 which affects the unity of the mobile terminal. In some implementations of the present disclosure, as illustrated in FIG. 4, the width of the paint layer 31 may be larger than the width of the insulating layer 32. For example, the width of the paint layer 31 may be 0.02-0.06 mm larger than the width of the insulating layer 32. In this way, the likelihood that the insulating layer 32 in the slot 2 may not be covered (e.g., entirely covered) due to operation errors can be greatly reduced or avoided. In some implementations of the present disclosure, the paint layer 31 may have a thickness of 0.2-0.3 mm which is appropriate since the color of the paint layer 31 may be affected if the thickness thereof is less than 0.2 mm while some of the material of the paint layer 31 may be unnecessary if the thickness thereof is larger than 0.3 mm.

It should be noted that the expression used herein in this document, "the outer surface of the paint layer may have substantially the same color as the outer surface of the substrate" should be broadly understood. The expression not only means that the colors of the outer surfaces of the paint layer and the substrate 1 are exactly the same, but also means that the outer surfaces of the paint layer and the substrate 1 have no significant color differences when observed by human eyes.

Figure 5:
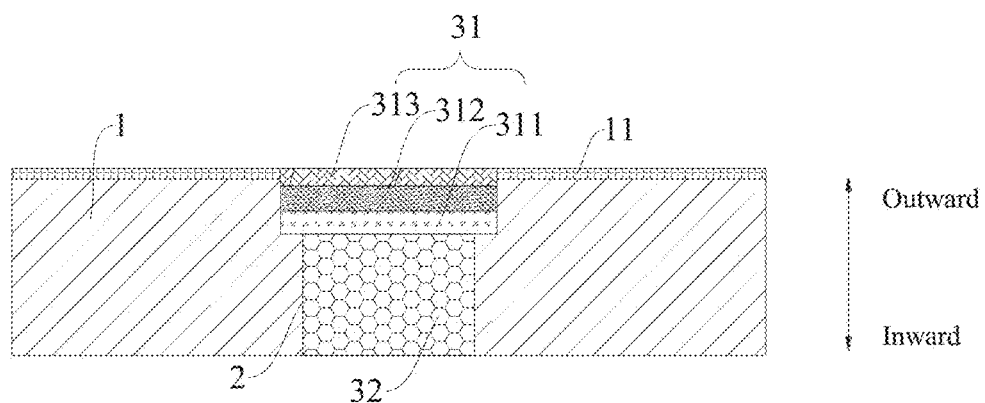
FIG. 5 illustrates a schematic cross-sectional structural view of a housing according to yet another implementation of the present disclosure.

According to one implementation of the present disclosure, the coating material used for forming the paint layer 31 is not particularly limited, and may be any coating material known in the art, and may be flexibly customized by persons skilled in the art. In some implementations of the present disclosure, as illustrated in FIG. 5, in order to ensure fine adhesion between the paint layer 31 and the insulating layer 32, the paint layer 31 may include a base paint layer 311 on the insulating layer 32, a colored paint layer 312 on the base paint layer 311, and a top paint layer 313 on the colored paint layer 312. By arranging the base paint layer 311, the adhesion between the paint layer 31 and the insulating layer 32 is enhanced. The colored paint layer 312 may contain at least one of colorant, pigment, silver powder, and the like, and determines the color of the paint layer 31. The colored paint layer 312 may have substantially the same color as the outer surface of the substrate 1, thereby effectively reducing the color difference between the slot 2 and the substrate 1 and improving the unity of the mobile terminal. The top paint layer 313 can effectively protect the colored paint layer 312, and render the color of the paint layer 31 richer. In one implementation of the present disclosure, the outer surface of the paint layer 31 has substantially the same color as the outer surface of the substrate 1; therefore, the slot 2 and the substrate 1 have no significant color differences, thereby enhancing the unity of the mobile terminal.

Figure 6:
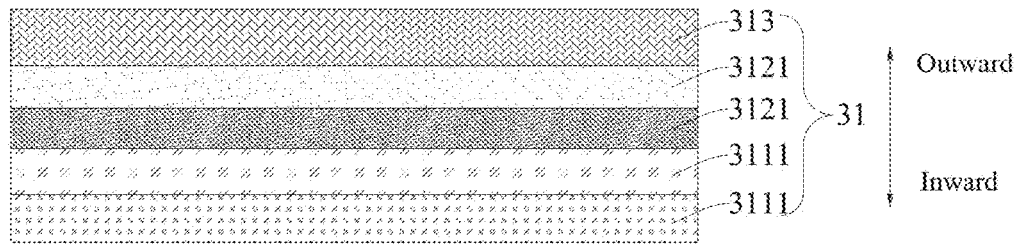
FIG. 6 illustrates a schematic cross-sectional view of a paint layer according to an implementation of the present disclosure.

In addition, in some implementations of the present disclosure, the arrangement of the base paint layer 311, the colored paint layer 312, and the top paint layer 313 is not particularly limited, and the base paint layer 311, the colored paint layer 312, and the top paint layer 313 may include at least one sub-layer, respectively, such that the paint layer 31 has better performance and effects. For example, in one implementation of the present disclosure, as illustrated in FIG. 6, the base paint layer 311 may include two base paint sub-layers 3111, and the colored paint layer 312 may include two colored paint sub-layers 3121, while the top paint layer 313 may include one (e.g., only one) top paint sub-layer. It should be understood by persons skilled in the art that the numbers of the sub-layers of the base paint layer 311, the colored paint layer 312, and the top paint layer 313 are merely illustrative of the technical solutions of the present disclosure and are not to be construed as a limit to the present disclosure. In other implementations, the base paint layer 311, the colored paint layer 312, and the top paint layer 313 may have different numbers of the sub-layers.

According to one implementation of the present disclosure, the material used for forming the insulating layer 32 is not particularly limited, and may be any non-conductive material known in the art. In some implementations of the present disclosure, the non-conductive material may include, but is not limited to, PPS, PBT, and the like.

According to one implementation of the present disclosure, in the housing, the exterior of the filling layer is the paint layer, and thus, the color of the outer surface of the paint layer can be effectively and conveniently adjusted such that the color of the outer surface of the paint layer is substantially the same as the color of the outer surface of the substrate, thereby significantly reducing the color difference between the slot and the substrate, significantly improving the unity of the mobile terminal, and contributing to the improvement of the radiation performance of the antenna.

In another aspect of the present disclosure, the present disclosure provides a method for manufacturing a housing for a mobile terminal having an antenna. According to an implementation of the present disclosure, referring to FIGS. 7 and 8, the method can begin at block 100.

At block S100, a substrate 1 used for the housing is prepared. The substrate 1 has a metal area.

In this process, the metal area is provided with a slot 2 penetrating through the substrate 1, and the slot 2 is filled with insulating material 4.

According to one implementation of the present disclosure, the substrate 1 has a shape not particularly limited and may be flexibly shaped by persons skilled in the art, as long as the substrate 1 can be mated with other members constituting the mobile terminal. According to one implementation of the present disclosure, the material forming the substrate 1 is also not particularly limited, and may be any material known in the art capable of forming the housing of the mobile terminal, for example, including, but not limited to, aluminum alloy and the like. In order to improve surface hardness and abrasion resistance of the metal substrate, expand the application scope thereof, and prolong the service life thereof, generally, the substrate 1 is anodized. Therefore, an anodized layer 11 is formed on the outer surface of the substrate 1.

According to one implementation of the present disclosure, the slot 2 is formed in the substrate 1 and penetrates through the substrate 1, and the slot 2 is filled with the insulating material 4. According to one implementation of the present disclosure, position, shape, number, etc., of the slot(s) 2 are not particularly limited, and any slot known in the art formed for the antenna is applicable here, as long as signals can be transmitted out. In some implementations of the present disclosure, the position, shape, number, etc., of the slot(s) 2 may be as illustrated in FIG. 1 or FIG. 2. It should be understood by persons skilled in the art that in some implementations of the present disclosure, the position, shape, number of the slot(s) 2 may be changed or modified according to antenna radiation.

According to one implementation of the present disclosure, the insulating material 4 is not particularly limited, and may be any non-conductive material known in the art, and may be flexibly customized by persons skilled in the art. In some implementations of the present disclosure, the non-conductive material may include, but is not limited to, PPS, PBT, and the like.

According to one implementation of the present disclosure, the process for preparing the substrate 1 used for the housing is not particularly limited, and any process known in the art which is capable of preparing the substrate 1 may be adopted. In some implementations of the present disclosure, a process for preparing the substrate 1 used for the housing includes, but is not limited to, molding the substrate 1, forming the slot 2 penetrating through the substrate 1 by cutting, etching, laser processing, or the like, and filling the slot 2 with the insulating material 4 by injection molding (e.g., NMT (Nano Molding Technology)) or the like.

At block S200, an insulating layer 32 is formed in the slot 2 and a groove is formed on the insulating layer 32. The groove is adjacent to an outer surface of the substrate 1.

According to one implementation of the present disclosure, the process for forming the insulating layer 32 in the slot 2 is not particularly limited, and may be customized by persons skilled in the art. The process for forming the insulating layer 32 in the slot 2 includes, but is not limited to, a CNC (Computer Numerical Control) process which allows for simple and convenient operation, has high efficiency, a high yield, and a low cost, and is suitable for mass manufacture.

Figure 7:
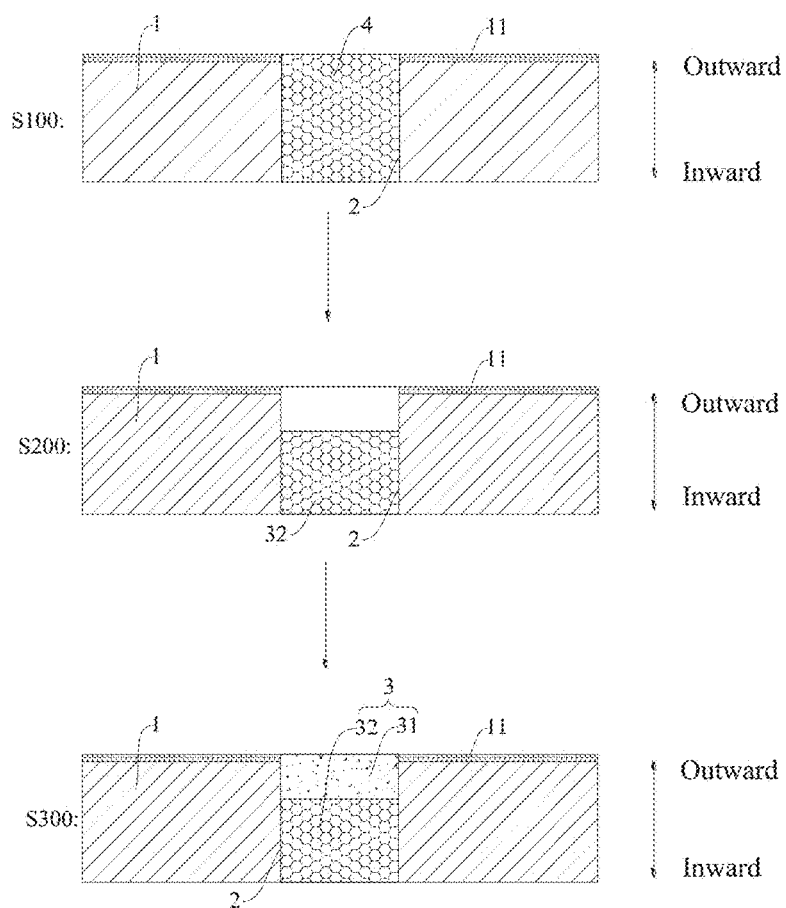
FIG. 7 illustrates a schematic flowchart of a method for manufacturing a housing according to an implementation of the present disclosure.

In some implementations of the present disclosure, in this process, referring to FIG. 7, a part of the insulating material 4 adjacent to the outer surface of the substrate is removed, i.e., a part of the insulating material 4 is removed in the thickness direction of the substrate 1, and thus the insulating material 4 is decreased in thickness. The remaining insulating material 4 forms the insulating layer 32, and the place where the insulating material 4 is removed forms a groove on the insulating layer and adjacent to an outer surface of the substrate 1. The groove may have the same width as the insulating layer 32, thereby ensuring that the paint layer 31 to be formed subsequently covers the insulating layer 32 (e.g., the entire insulating layer 32), and avoiding exposure of a part of the insulating layer which affects the unity of the mobile terminal. In other implementations of the present disclosure, referring to FIG. 8, in this process, a part of the insulating material 4 adjacent to the outer surface of the housing and a part of the substrate 1 adjacent to the part of the insulating material 4 are removed, i.e., a part of the insulating material 4 and a part of the substrate 1 adjacent to the part of the insulating material 4 are removed in the thickness direction of the substrate 1, so as to form a groove having a width larger than the insulating layer 32. For example, the width of the groove may be 0.02-0.06 mm larger than the width of the insulating layer 32. In this way, the likelihood that the insulating layer 32 in the slot 2 may not be covered (e.g., entirely covered) due to operation errors can be greatly reduced or avoided. That is to say, it can also be ensured that the paint layer 31 formed subsequently covers the insulating layer 32 (e.g., the entire insulating layer 32), even if a certain deviation in position alignment occurs during removal.

At block S300, a paint layer 31 is formed in the groove.

According to one implementation of the present disclosure, the process for forming the paint layer 31 is not particularly limited, and may be customized by persons skilled in the art. In some implementations of the present disclosure, the process for forming the paint layer 31 includes, but is not limited to, spraying which allows for simple and convenient operation and simple equipment, and has easy controllability. In some implementations of the present disclosure, after the substrate 1 is covered by a jig, the groove formed by removing a part of the insulating material 4 may be sprayed several times to form the paint layer 31 in the groove. The purpose of spraying several times is to fill the groove.

According to one implementation of the present disclosure, the outer surface of the paint layer 31 has substantially the same color as the outer surface of the substrate 1, and thus, the slot 2 and the substrate 1 have no significant color differences, thereby enhancing the unity of the mobile terminal. In some implementations of the present disclosure, at least one of colorant, pigment, and silver powder may be added into the coating material used for forming the paint layer 31, and several appropriate post-processes (including, but not limited to, grinding, sandblasting) are performed on the paint layer 31, such that the formed paint layer 31 has substantially the same color and roughness as the outer surface of the substrate 1, thereby effectively improving the unity of the mobile terminal.

According to one implementation of the present disclosure, in order to ensure good adhesion between the paint layer 31 and the insulating layer 32, as illustrated in FIG. 5, the paint layer 31 may include a base paint layer 311 formed on the insulating layer 32, a colored paint layer 312 formed on the base paint layer 311, and a top paint layer 313 formed on the colored paint layer 312. Accordingly, when the paint layer 31 is formed, firstly the base paint layer 311 is formed on the insulating layer 32, then the colored paint layer 312 is formed on the base paint layer 311, and finally the top paint layer 313 is formed on the colored paint layer 312. By arranging the base paint layer 311, the adhesion between the paint layer 31 and the insulating layer 32 is enhanced. The colored paint layer 312 may contain at least one of colorant, pigment, silver powder, and the like, and determines the color of the paint layer 31. The colored paint layer 312 may have substantially the same color as the outer surface of the substrate 1, thereby effectively reducing the color difference between the slot 2 and the substrate 1 and improving the unity of the mobile terminal. The top paint layer 313 can effectively protect the colored paint layer 312, and render the color of the paint layer 31 richer. In one implementation of the present disclosure, the base paint layer 311 may be sprayed twice or thrice, the colored paint layer 312 may be sprayed twice or thrice, and the top paint layer 313 may be sprayed once. Naturally, it should be understood by persons skilled in the art that the foregoing is merely illustrative of the technical solution of the present disclosure and is not to be construed as a limit to the present disclosure. In other implementations, the base paint layer 311, the colored paint layer 312, and the top paint layer 313 may be sprayed different times.

In some implementations of the present disclosure, the arrangement of the base paint layer 311, the colored paint layer 312, and the top paint layer 313 is not particularly limited, and the base paint layer 311, the colored paint layer 312, and the top paint layer 313 may include a plurality of sub-layers respectively, such that the paint layer 31 has better performance and effects. For example, in one implementation of the present disclosure, as illustrated in FIG. 6, the base paint layer 311 may include two base paint sub-layers 3111, and the colored paint layer 312 may include two colored paint sub-layers 3121, while the top paint layer 313 may include one (e.g., only one) top paint sub-layer. It should be understood by persons skilled in the art that the numbers of the sub-layers of the base paint layer 311, the colored paint layer 312, and the top paint layer 313 are merely illustrative of the technical solutions of the present disclosure and are not to be construed as a limit to the present disclosure. In other implementations, the base paint layer 311, the colored paint layer 312, and the top paint layer 313 may have different numbers of the sub-layers.

According to one implementation of the present disclosure, the method for manufacturing a housing may further include grinding the paint layer 31. In some implementations of the present disclosure, after the spraying is completed, the paint layer 31 is baked until it is cured (e.g., completely cured), and then the paint layer 31 is ground. The purpose of grinding is to remove the paint spattered on the area of the substrate 1 uncovered by the jig, and render the outer surface of the paint layer 31 flush with the outer surface of the substrate 1.

By means of the method, the paint layer 31 covering the insulating layer 32 can be formed in the slot 2, and the color of the outer surface of the paint layer 31 can be simply and conveniently rendered substantially the same as the outer surface of the substrate 1, thereby significantly reducing the color difference between the slot 2 and the outer surface of the substrate 1 and greatly improving the unity of the mobile terminal. Meanwhile, the method for manufacturing a housing enables the antenna to have fine radiation performance, allows for simple, convenient and rapid operation, has easy controllability and a low cost, and is suitable for mass manufacture.

Furthermore, it should be noted that the processes in the foregoing method for manufacturing a housing may be freely combined with other processes for manufacturing a housing. For example, the processes in the foregoing method for manufacturing a housing may be performed just after the slot 2 is filled with the insulating material 4, or the processes in the foregoing method for manufacturing a housing may be performed after the slot 2 is filled with the insulating material 4 and the substrate 1 is polished, sandblasted, and anodized.

In yet another aspect of the present disclosure, the present disclosure further provides a mobile terminal. According to an implementation of the present disclosure, the mobile terminal includes the foregoing housing and an antenna accommodated in the housing. In this implementation, the filling layer of the housing is configured to provide a passage for signals of the antenna. It will be understood by persons skilled in the art that the mobile terminal of the present disclosure may further include other members of a conventional mobile terminal, in addition to the foregoing housing. For example, a mobile phone may include the foregoing housing of the present disclosure, as well as other conventional members such as a glass cover plate, a touch panel, a camera module, a fingerprint identification module, and the like. The mobile terminal according to the present disclosure is not particularly limited, and may be any mobile smart device. The mobile terminal may include, but is not limited to, a mobile phone, a tablet PC, a notebook computer, a POS terminal, and the like.

Example 1

Referring to FIG. 7, the substrate 1 for the mobile terminal is prepared with a conventional molding process. The slot 2 penetrating through the substrate 1 is formed in the substrate 1, and the slot 2 is filled with the insulating material 4. Then, a part of the insulating material 4 adjacent to the outer surface of the substrate 1 is removed with the CNC process, i.e., the insulating material 4 is reduced from outside to inside in the thickness direction of the substrate 1, so as to form a groove. The remaining part of the insulating material 4 forms the insulating layer 32. The groove having the same width as the insulating layer 32. Then, the paint layer 31 is formed on the outer surface of the insulating layer 32 by spraying. In this example, the paint layer 31 includes a base paint layer, a colored paint layer, and a top paint layer. The base paint layer is formed at first by spraying twice or thrice, the colored paint layer is formed by spraying twice or thrice, and the top paint layer is formed by spraying once. Before the paint layer 31 is formed, colorant, pigment, silver powder, or the like is added into the coating material to be sprayed, so as to adjust the color of the coating material such that the formed paint layer 31 has substantially the same color as the outer surface of the substrate 1. Then, the formed paint layer is ground, so as to remove the paint spattered on the area of the substrate 1 uncovered by the jig and render the outer surface of the paint layer 31 in the slot 2 flush with the outer surface of the substrate 1. Then, the substrate 1 is polished, sandblasted, and anodized, such that the paint layer 31 and the substrate 1 have substantially the same roughness, and the housing is manufactured.

Example 2

Figure 8:
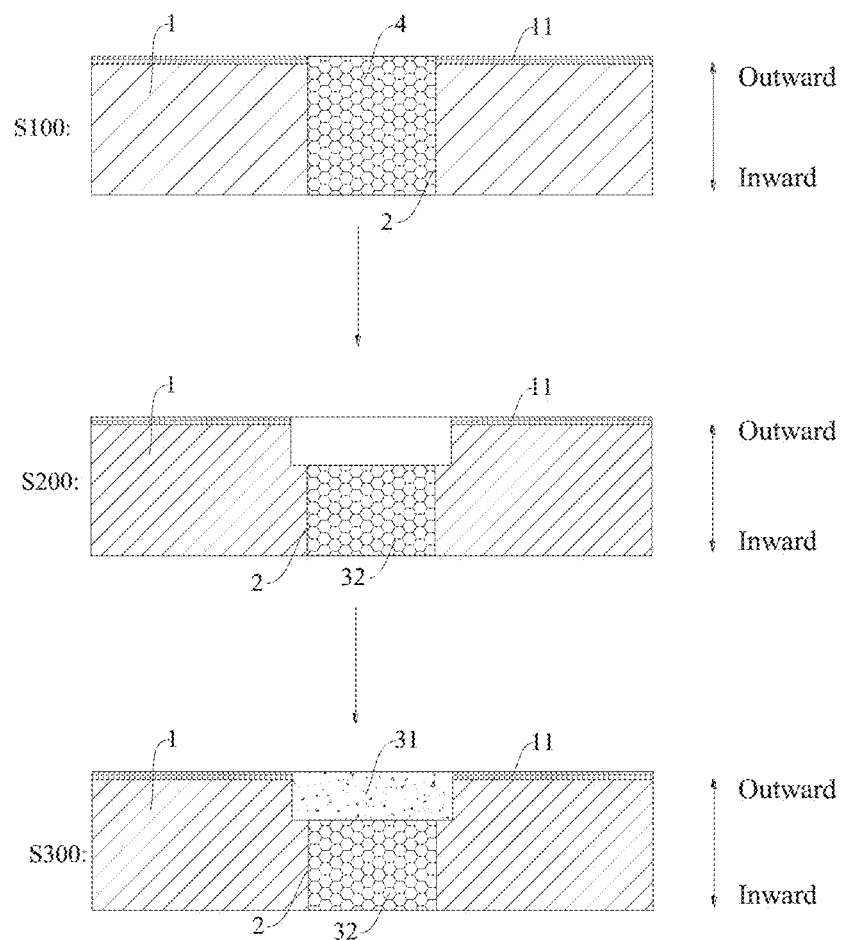
FIG. 8 illustrates a schematic flowchart of a method for manufacturing a housing according to another implementation of the present disclosure.

Referring to FIG. 8, the substrate 1 for the mobile terminal is prepared with a conventional molding process. The slot 2 penetrating through the substrate 1 is formed in the substrate 1, and the slot 2 is filled with the insulating material 4. Then, a part of the insulating material 4 adjacent to the outer surface of the substrate 1 and a part of the substrate 1 adjacent to the part of the insulating material 4 is removed, i.e., the insulating material 4 and a part of the substrate 1 adjacent to the insulating material 4 is reduced from outside to inside in the thickness direction of the substrate 1, so as to form a groove. The remaining part of the insulating material 4 forms the insulating layer 32. The groove having a width larger than the insulating layer 32. Then, the paint layer 31 is formed on the outer surface of the insulating layer 32 by spraying. In this example, the paint layer 31 includes a base paint layer, a colored paint layer, and a top paint layer. The base paint layer is formed at first by spraying twice or thrice, the colored paint layer is formed by spraying twice or thrice, and the top paint layer is formed by spraying once. Before the paint layer 31 is formed, colorant, pigment, silver powder, or the like is added into the coating material to be sprayed, so as to adjust the color of the coating material such that the formed paint layer 31 has substantially the same color as the outer surface of the substrate 1. Then, the formed paint layer is ground, so as to remove the paint spattered on the area of the substrate 1 uncovered by the jig and render the outer surface of the paint layer 31 in the slot 2 flush with the outer surface of the substrate 1. Then, the substrate 1 is polished, sandblasted, and anodized, such that the paint layer 31 and the substrate 1 have substantially the same roughness, and the housing is manufactured.

In the description of the present disclosure, it should be understood that orientational or positional relationships indicated by the terms "central", "longitudinal", "transverse", "length", "width", "thickness", "upper", "lower", "front", "back", "left", "right", "vertical", "horizontal", "top", "bottom", "inside", "outside", "clockwise", "counterclockwise", "axial", "radial", "circumferential", and the like are those as illustrated in accompanying drawings, and are merely for facilitating and simplifying the description of the present disclosure, rather than indicating or implying that the referred devices or elements should have a specific orientation and should be constructed and operated in a particular orientation, and thus cannot be construed as a limit to the present disclosure.

In addition, the terms "first", "second" are merely for illustrative purposes, and cannot be construed as indicating or implying relative importance or implicitly indicating the number of referred technical features. Therefore, a feature defined by "first", "second" may explicitly or implicitly include one or more features. In the description of the present disclosure, the term "plural" means two or more, unless specified otherwise.

In the present disclosure, unless specified otherwise, the terms "mount", "connect", "couple", "fix", and the like should be broadly understood, and may include, for example, a fixed connection, a detachable connection, an integral connection, a mechanical connection, an electrical connection, a direct connection, an indirect connection via an intermediate medium, a communication between two elements, and an interactive relationship between two elements. For persons skilled in the art, the specific meaning of the foregoing terms in the present disclosure should be understood in light of the specific circumstance.

In the present disclosure, unless specified otherwise, the first feature being "on" or "beneath" the second feature may mean that the first feature may be in direct contact with the second feature, or the first feature may be in indirect contact with the second feature via an intermediate medium. Moreover, the first feature being "on", "over" or "above" the second feature may mean that the first feature is over or obliquely above the second feature, or merely mean that the first feature has a horizontal level higher than the second feature. The first feature being "beneath", "under" or "below" the second feature may mean that the first feature is under or obliquely below the second feature, or merely mean that the first feature has a horizontal level lower than the second feature.

In the description of this specification, the terms "one implementation", "some implementations", "example", "embodiment", "some examples", or the like is intended to mean that specific features, structures, materials, or characteristics described in conjunction with the implementation or example are included in at least one implementation or example of the present disclosure. In the specification, the example description of the foregoing terms does not necessarily refer to the same implementation or example. Moreover, when not conflicting, different implementations or examples described in the specification as well as features in the different implementations or examples may be conjoined or combined by persons skilled in the art.

Although the implementations of the disclosure have been illustrated and described above, it should be understood that the foregoing implementations are examples and are not to be construed as a limit to the present disclosure. Changes, modifications, substitutions, and variations could be made to the foregoing implementations by persons skilled in the art without departing from the scope of the present disclosure.

What is claimed is:

1. A housing comprising:
   a substrate comprising a metal area;
   a slot defined in the metal area of the substrate and penetrating through the substrate; and
   a filling layer received in the slot and comprising an insulating layer and a paint layer on the insulating layer;
   wherein the paint layer comprises:
      a base paint layer formed on the insulating layer;
      a colored paint layer formed on the base paint layer, wherein the colored paint layer is configured to determine the color of the paint layer; and
      a top paint layer formed on the colored paint layer, wherein the top layer is configured to protect the colored paint layer.

2. The housing of claim 1, wherein the paint layer has the same width as the insulating layer.

3. The housing of claim 1, wherein the paint layer has a width larger than the insulating layer.

4. The housing of claim 3, wherein the width the paint layer is 0.02 mm-0.06 mm larger than that of the insulating layer.

5. The housing of claim 1, wherein the paint layer has a thickness of 0.2 mm-0.3 mm.

6. The housing of claim 1, wherein the colored paint layer has substantially the same color as the outer surface of the substrate, to cause an outer surface of the paint layer has the same color as an outer surface of the substrate.

7. The housing of claim 1, wherein an outer surface of the paint layer is flush with an outer surface of the substrate.

8. The housing of claim 6, wherein the top paint layer is further configured to render the color of the paint layer richer.

9. The housing of claim 8, wherein the base paint layer, the colored paint layer, and the top paint layer each comprises at least one sub-layer.

10. The housing of claim 9, wherein the base paint layer, the colored paint layer, and the top paint layer each comprises different numbers of sub-layers.

11. A mobile terminal comprising a housing and an antenna accommodated in the housing, wherein the housing comprises:
    a substrate comprising a metal area;
    a slot defined in the metal area of the substrate and penetrating through the substrate; and
    a filling layer received in the slot and comprising an insulating layer and a paint layer on the insulating layer, the filling layer being configured to provide a passage for signals of the antenna;
    wherein the paint layer comprises:
       a base paint layer formed on the insulating layer;
       a colored paint layer formed on the base paint layer, wherein the colored paint layer is configured to determine the color of the paint layer; and
       a top paint layer formed on the colored paint layer, wherein the top layer is configured to protect the colored paint layer.

12. The mobile terminal of claim 11, wherein an outer surface of the paint layer has the same color as an outer surface of the substrate, and is flush with the outer surface of the substrate.

* * * * *